(12) United States Patent
Nam

(10) Patent No.: US 8,866,269 B2
(45) Date of Patent: Oct. 21, 2014

(54) SEMICONDUCTOR CHIPS HAVING IMPROVED SOLIDITY, SEMICONDUCTOR PACKAGES INCLUDING THE SAME AND METHODS OF FABRICATING THE SAME

(71) Applicant: SK hynix Inc., Icheon-si (KR)

(72) Inventor: Jong Hyun Nam, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/719,199

(22) Filed: Dec. 18, 2012

(65) Prior Publication Data

US 2014/0015115 A1 Jan. 16, 2014

(30) Foreign Application Priority Data

Jul. 16, 2012 (KR) .................. 10-2012-0077408

(51) Int. Cl.
   - H01L 29/06 (2006.01)
   - H01L 23/00 (2006.01)
   - H01L 21/56 (2006.01)
   - H01L 21/78 (2006.01)
   - H01L 23/31 (2006.01)

(52) U.S. Cl.
   CPC ....... H01L 23/562 (2013.01); *H01L 2224/2784* (2013.01); *H01L 2224/32225* (2013.01); *H01L 2224/2919* (2013.01); H01L 24/96 (2013.01); *H01L 2224/94* (2013.01); *H01L 2924/15311* (2013.01); H01L 21/563 (2013.01); *H01L 2224/48227* (2013.01); *H01L 2224/73265* (2013.01); H01L 21/78 (2013.01); H01L 23/3128 (2013.01)
   USPC ........................................................ 257/622

(58) Field of Classification Search
   CPC ..... H01L 21/78; H01L 21/563; H01L 23/562; H01L 23/3128; H01L 24/96
   USPC .................................. 257/622; 438/113, 460
   See application file for complete search history.

(56) References Cited

U.S. PATENT DOCUMENTS

| | | | | |
|---|---|---|---|---|
| 6,406,636 | B1 * | 6/2002 | Vaganov | 216/2 |
| 2007/0035008 | A1 * | 2/2007 | Wu et al. | 257/700 |
| 2011/0012253 | A1 * | 1/2011 | Kwang et al. | 257/698 |
| 2012/0091562 | A1 * | 4/2012 | Roh | 257/618 |

FOREIGN PATENT DOCUMENTS

| | | | |
|---|---|---|---|
| KR | 1020020061737 | A | 7/2002 |
| KR | 1020060010463 | A | 2/2006 |
| KR | 100766171 | B1 | 10/2007 |
| KR | 1020110069948 | A | 6/2011 |
| KR | 1020110077485 | A | 7/2011 |

* cited by examiner

*Primary Examiner* — A. Sefer
(74) *Attorney, Agent, or Firm* — William Park & Associates Patent Ltd.

(57) ABSTRACT

Semiconductor chips are provided. The semiconductor chip includes a semiconductor chip body having an arch-shaped groove in a backside thereof and a non-conductive material pattern filling the arch-shaped groove. Related methods are also provided.

11 Claims, 4 Drawing Sheets

SEMICONDUCTOR CHIPS HAVING IMPROVED SOLIDITY, SEMICONDUCTOR PACKAGES INCLUDING THE SAME AND METHODS OF FABRICATING THE SAME

CROSS-REFERENCE TO RELATED APPLICATION

The present application claims priority under 35 U.S.C 119(a) to Korean Application No. 10-2012-0077408, filed on Jul. 16, 2012, in the Korean intellectual property Office, which is incorporated herein by reference in its entirety as set forth in full.

BACKGROUND

1. Technical Field

Embodiments of the present disclosure generally relates to electronic devices and, more particularly, to semiconductor chips having improved solidity, semiconductor packages including the same and methods of fabricating the same.

2. Related Art

In the electronic industry, semiconductor packages are generally fabricated by encapsulating semiconductor chips having integrated circuits with resin material or ceramic material to protect the semiconductor chips from an external environment, and the semiconductor packages are mounted on boards of electronic systems. Recently, the semiconductor packages are also fabricated to improve the performance and/or quality of the electronic systems. That is, high performance semiconductor packages are increasingly in demand with the development of lighter, smaller, thinner, faster and multi-functional electronic systems. Accordingly, assembly technologies for making the semiconductor packages have been continuously developed to provide various high performance semiconductor packages.

Recently, large capacity of memory modules have been more increasingly in demand with the development of lighter, smaller, faster, multi-functional, and higher performance electronic systems. In response to such a demand, multi-chip stacked packages have been proposed. The multi-chip stacked packages are fabricated by vertically stacking a plurality of semiconductor chips on a package substrate. However, the multi-chip stacked packages may be thicker than single-chip packages. Thus, a back grinding process may be applied to a backside surface of a semiconductor wafer including a plurality of semiconductor chips to reduce the thickness of the semiconductor chip, and the thinned semiconductor chips may then be separated from each other using a die sawing process. However, when the semiconductor chips are separated from each other after the backside surface of the semiconductor wafer is ground, cracks may be more readily generated in the thinned semiconductor chips or edges of the thinned semiconductor chips may be more readily broken away during the die sawing process or a subsequent die attaching process. This may be due to a low solidity of the thinned semiconductor chips. To solve this problem, after the semiconductor wafer is diced into two parts using a half cutting process, two separated parts of the semiconductor wafer may be ground. Nevertheless, there may be some limitations in improving the solidity of the thinned semiconductor chips.

SUMMARY

Various embodiments are directed to semiconductor chips having improved solidity, semiconductor packages including the same and methods of fabricating the same.

According to various embodiments, a semiconductor chip includes a semiconductor chip body having an arch-shaped groove in a backside thereof and a non-conductive material pattern filling the arch-shaped groove.

In various embodiments, the non-conductive material pattern may be a material having a solidity which is greater than that of the semiconductor chip body.

In various embodiments, the non-conductive material pattern may have an adhesive property.

In various embodiments, the non-conductive material pattern may include an epoxy type polymer material or a silicon resin material.

According to various embodiments, a semiconductor package includes a substrate, a semiconductor chip attached to the substrate and a mold resin material encapsulating the semiconductor chip. The semiconductor chip includes a semiconductor chip body having an arch-shaped groove in a backside thereof and a non-conductive material pattern filling the arch-shaped groove.

In various embodiments, the non-conductive material pattern may be a material having a solidity which is greater than that of the semiconductor chip body.

In various embodiments, the non-conductive material pattern may have an adhesive property.

In various embodiments, the non-conductive material pattern may include an epoxy type polymer material or a silicon resin material.

In various embodiments, the non-conductive material pattern may be attached to the substrate.

According to various embodiments, a method of fabricating a semiconductor chip includes forming a plurality of arch-shaped grooves in a backside of a semiconductor wafer having a plurality of semiconductor chips, forming a plurality of non-conductive material patterns in respective ones of the plurality of arch-shaped grooves, and separating the plurality of semiconductor chips including the non-conductive material patterns.

In various embodiments, forming the plurality of arch-shaped grooves may include attaching a jig having a plurality of openings that expose respective ones of the semiconductor chips to a backside surface of the semiconductor wafer, etching a backside of the semiconductor wafer using the jig as an etch mask, and detaching the jig from the semiconductor wafer.

In various embodiments, the backside of the semiconductor wafer may be etched using at least one of a physical etching process and a chemical etching process.

In various embodiments, forming the plurality of non-conductive material patterns may include coating a non-conductive material layer on a backside surface of the semiconductor wafer to fill the arch-shaped grooves, and grinding the non-conductive material layer and the semiconductor wafer.

According to various embodiments, a method of fabricating a semiconductor package includes forming a plurality of arch-shaped grooves in a backside of a semiconductor wafer having a plurality of semiconductor chips, forming a plurality of non-conductive material patterns in respective ones of the plurality of arch-shaped grooves, separating the plurality of semiconductor chips including the non-conductive material patterns, attaching one of the separated semiconductor chips to a substrate, electrically connecting the attached semiconductor chip to the substrate through wires, and forming a mold resin material encapsulating the attached semiconductor chip and the wires.

In various embodiments, forming the plurality of arch-shaped grooves may include attaching a jig having a plurality of openings that expose respective ones of the semiconductor chips to a backside surface of the semiconductor wafer, etching a backside of the semiconductor wafer using the jig as an etch mask, and detaching the jig from the semiconductor wafer.

In various embodiments, the backside of the semiconductor wafer may be etched using at least one of a physical etching process and a chemical etching process.

In various embodiments, forming the plurality of non-conductive material patterns may include coating a non-conductive material layer on a backside surface of the semiconductor wafer to fill the arch-shaped grooves, and grinding the non-conductive material layer and the semiconductor wafer.

BRIEF DESCRIPTION OF THE DRAWINGS

Embodiments of the inventive concept will become more apparent in view of the attached drawings and accompanying detailed description, in which.

DETAILED DESCRIPTION

Figure 1:
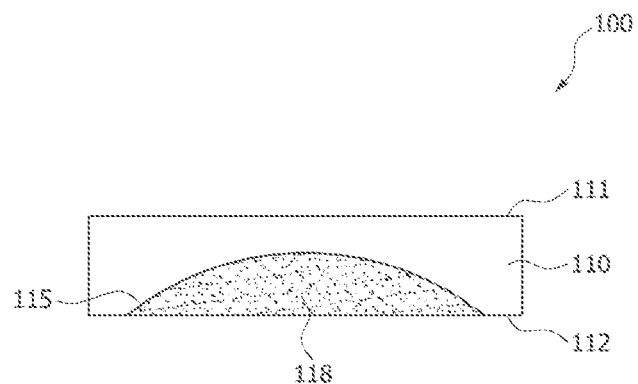
FIG. 1 is a cross sectional view illustrating a semiconductor chip according to various embodiments.

FIG. 1 is a cross sectional view illustrating a semiconductor chip according to various embodiments. Referring to FIG. 1, a semiconductor chip 100 according to an embodiment may be configured to include a semiconductor chip body 110 and a non-conductive material pattern 118, and the semiconductor chip body 110 may have a top surface 111 and a bottom surface 112. The semiconductor chip body 110 may include a semiconductor material, for example, a silicon material. Although not shown in the figures, active elements such as transistors and/or passive elements such as capacitors or inductors may be disposed in the semiconductor chip body 110. An arch-shaped groove 115 may be disposed to be adjacent to the bottom surface 112 of the semiconductor chip body 110. The arch-shaped groove 115 may be filled with the non-conductive material pattern 118. The non-conductive material pattern 118 may have a solidity which is greater or stronger than that of the semiconductor chip body 110, for example, a silicon material. Further, the non-conductive material pattern 118 may have an adhesive property. In various embodiments, the non-conductive material pattern 118 may include an epoxy type polymer material or a silicon resin material. As described above, an interface between the non-conductive material pattern 118 and the semiconductor chip body 110 may have an arch-shaped configuration, and the non-conductive material pattern 118 may be stronger than the semiconductor chip body 110 in terms of the solidity. In particular, the non-conductive material pattern 118 may fill the arch-shaped groove 115. Thus, the solidity of the semiconductor chip 100 may be remarkably improved.

Figure 2:
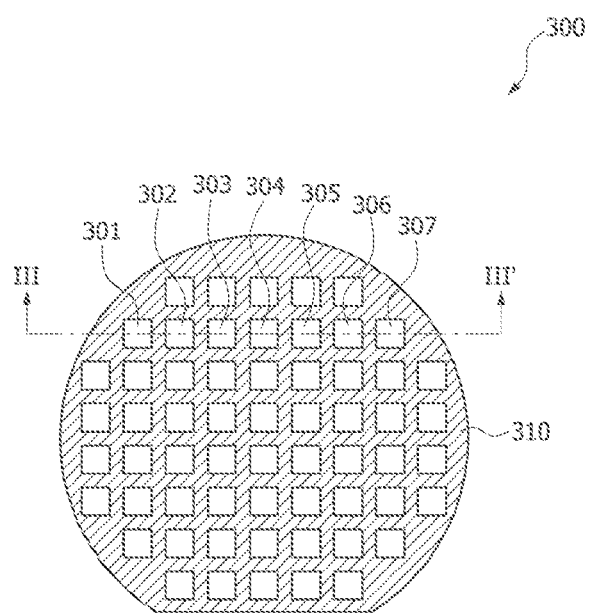
FIG. 2 is a plan view of a semiconductor wafer including a semiconductor chip of FIG. 1.
Figure 3:
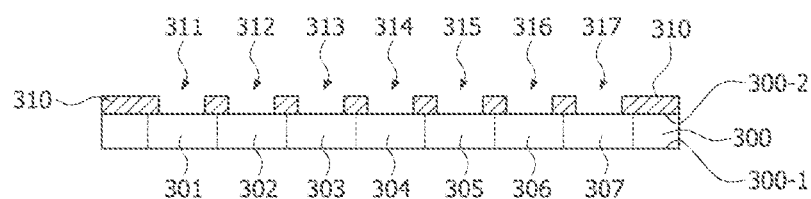
FIGS. 3, 4, 5 and 6 are cross sectional views taken along a line III-III' of FIG. 2 to illustrate a method of fabricating semiconductor chips according to various embodiments.

FIG. 2 is a plan view of a semiconductor wafer including a semiconductor chip of FIG. 1, and FIGS. 3, 4, 5 and 6 are cross sectional views taken along a line III-III' of FIG. 2 to illustrate a method of fabricating semiconductor chips according to various embodiments. Referring to FIGS. 2 and 3, a semiconductor wafer 300 including a plurality of semiconductor chips 301, 302, 303, 304, 305, 306 and 307 may be provided, and the semiconductor wafer 300 may have a top surface 300-1 and a bottom or back surface 300-2. The semiconductor wafer 300 may be flipped such that the bottom or back surface 300-2 is located at a higher level than the top surface 300-1. The semiconductor wafer 300 may be flipped using a carrier wafer (not shown). Each of the semiconductor chips 301, 302, 303, 304, 305, 306 and 307 may include active elements and/or passive elements.

A jig 310 may then be attached to the bottom or back surface 300-2 of the semiconductor wafer 300 using an adhesive agent. The adhesive agent used in attachment of the jig 310 may be a material that loses its adhesive property via a chemical reaction to easily detach the jig 310 from the semiconductor wafer 300 in a subsequent process. For example, the adhesive agent used in attachment of the jig 310 may be a material that loses its adhesive property when exposed to ultraviolet (UV) rays. In some embodiments, the jig 310 may be fixed to the semiconductor wafer 300 using another fixing means instead of the adhesive agent.

The jig 310 may have a plurality of openings 311, 312, 313, 314, 315, 316 and 317 exposing the back or bottom surfaces 300-2 of the semiconductor chips 301, 302, 303, 304, 305, 306 and 307. The number of the openings may be equal to the number of the semiconductor chips. That is, the openings may expose the corresponding semiconductor chips. Specifically, the opening 311 may expose the back or bottom surface 300-2 of the semiconductor chip 301, and the opening 312 may expose the back or bottom surface 300-2 of the semiconductor chip 302. Similarly, the other openings may expose the back or bottom surfaces 300-2 of the corresponding semiconductor chips, respectively. The jig 310 may be formed of a material having an etch selectivity with respect to the wafer 300, for example, a silicon material.

Figure 4:
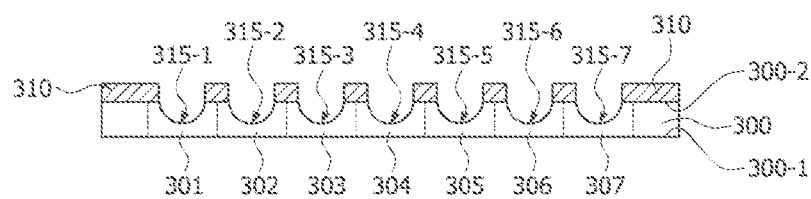

Referring to FIG. 4, the backside or bottom surfaces 300-2 of the semiconductor wafer 300 may be etched using the jig 310 as an etch mask to form a plurality of arch-shaped grooves 315-1, 315-2, 315-3, 315-4, 315-5, 315-6 and 315-7 in respective ones of the semiconductor chips 301, 302, 303, 304, 305, 306 and 307. In various embodiments, the etching process for forming the arch-shaped grooves 315-1, 315-2, 315-3, 315-4, 315-5, 315-6 and 315-7 may be performed using a physical etching process or a chemical etching process. Alternatively, the etching process for forming the arch-shaped grooves 315-1, 315-2, 315-3, 315-4, 315-5, 315-6 and 315-7 may be performed using both the physical etching process and the chemical etching process. A depth of the arch-shaped grooves 315-1, 315-2, 315-3, 315-4, 315-5, 315-6 and 315-7 may be appropriately controlled such that the active elements and/or the passive elements formed in the semiconductor chips 301, 302, 303, 304, 305, 306 and 307 are not damaged by the etching process.

Figure 5:
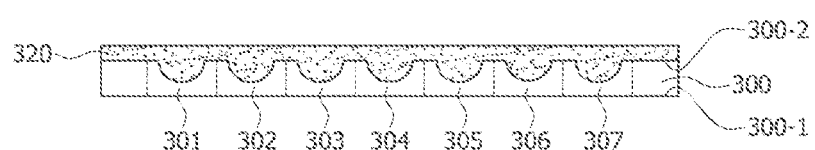

Referring FIG. 5, after formation of the arch-shaped grooves 315-1, 315-2, 315-3, 315-4, 315-5, 315-6 and 315-7, the jig 310 may be detached or removed from the semiconductor wafer 300. A non-conductive material layer 320 may be coated on the backside or bottom surface 300-2 of the substrate where the jig 310 is removed. The non-conductive material layer 320 may be formed of a material having a solidity which is greater or stronger than that of the semiconductor wafer 300, for example, a silicon wafer. Further, the non-conductive material layer 320 may be formed of a material having an adhesive property. Moreover, the non-conductive material layer 320 may be formed of a material having substantially the same or similar grinding rate as the semiconductor wafer 300, for example, a silicon wafer. In various embodiments, the non-conductive material layer 320 may be formed of an epoxy type polymer material or a silicon resin material.

Figure 6:
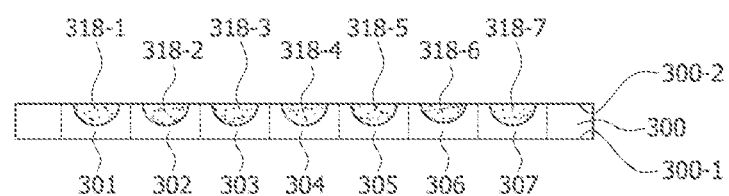

Referring to FIG. 6, the non-conductive material layer 320 may be ground to expose the backside or bottom surface 300-2 of the semiconductor wafer 300. Subsequently, the semiconductor wafer 300 and the non-conductive material layer 320 remaining in the arch-shaped grooves 315-1, 315-2, 315-3, 315-4, 315-5, 315-6 and 315-7 may be continuously ground until the semiconductor wafer 300 has a desired thickness. Even after the semiconductor wafer 300 is ground to have a desired thickness, portions of the non-conductive material layer 320 may still remain in respective ones of the arch-shaped grooves 315-1, 315-2, 315-3, 315-4, 315-5, 315-6 and 315-7. That is, non-conductive material patterns 318-1, 318-2, 318-3, 318-4, 318-5, 318-6 and 318-7 may be formed in respective ones of the arch-shaped grooves 315-1, 315-2, 315-3, 315-4, 315-5, 315-6 and 315-7 after the semiconductor wafer 300 is ground to have a desired thickness. The ground semiconductor wafer 300 may then be diced using a die sawing process to separate the semiconductor chips 301, 302, 303, 304, 305, 306 and 307 from each other. As a result, a plurality of semiconductor chips having the same structure as the semiconductor chip 100 illustrated in FIG. 1 may be obtained.

According to the above description, the grinding process may be followed by the die sawing process. However, in various embodiments, the grinding process may be preceded by a half cutting process. That is, the semiconductor wafer 300 including the non-conductive material layer 320 may be divided into a first half part and a second half part using the half cutting process, and the grinding process may be applied to the non-conductive material layers 320 of the first and second half parts of the semiconductor wafer 300.

Figure 7:
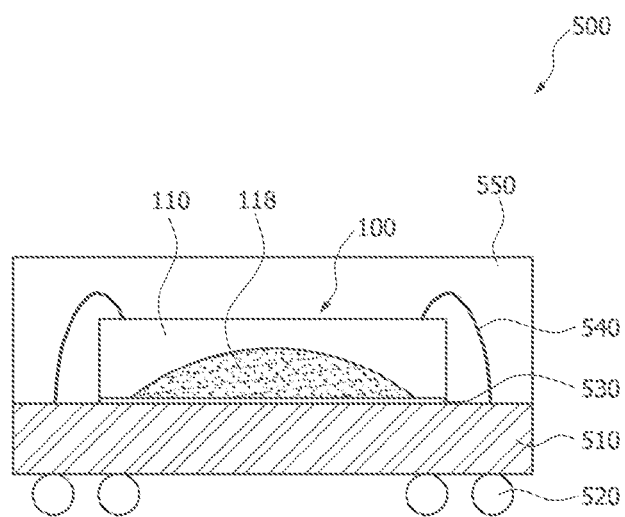
FIG. 7 is a cross sectional view illustrating a semiconductor package according to various embodiments and a method of fabricating the same.

FIG. 7 is a cross sectional view illustrating a semiconductor package according to various example embodiments and a method of fabricating the same. Referring to FIG. 7, a semiconductor package 500 according to an embodiment may be configured to include a substrate 510, a semiconductor chip 100, semiconductor chip body 110, and a mold resin material 550. The substrate 510 may be a package substrate, and solder balls 520 may be attached to a bottom surface of the substrate 510. The semiconductor package 500 may be electrically connected to an external device through the solder balls 520. The number of the solder balls 520 may be determined according to the number of input/output terminals of the semiconductor package 500.

The semiconductor chip 100 may be mounted on or attached to a top surface of the substrate 510 using an adhesive agent 530. The semiconductor chip 100 may have substantially the same configuration as described with reference to FIG. 1. That is, the semiconductor chip 100 may include an arch-shaped groove in the backside thereof, and the arch-shaped groove may be filled with a non-conductive material pattern 118. The non-conductive material pattern 118 and the backside surface of the semiconductor chip 100 may be attached to the top surface of the substrate 510 using the adhesive agent 530, as described above. When the non-conductive material pattern 118 has an adhesive property, the non-conductive material pattern 118 may be directly attached to the top surface of the substrate 510 without use of the adhesive agent 530. However, even though the non-conductive material pattern 118 has an adhesive property, the non-conductive material pattern 118 may be attached to the top surface of the substrate 510 using the adhesive agent 530. In such a case, adhesion between the semiconductor chip 100 and the substrate 510 may be improved more. The semiconductor chip 100 may be electrically connected to the substrate 510 through wires 540. The semiconductor chip 100 and the wires 540 may be encapsulated by a mold resin material 550.

To fabricate the semiconductor package 500, the semiconductor chip 100 may be formed using the same manners as described with reference to FIGS. 2 to 6, and the semiconductor chip 100 may be attached to the top surface of the substrate 510 using an adhesive agent 530. When the semiconductor chip 100 is attached to the top surface of the substrate 510, the non-conductive material pattern 118 of the semiconductor chip 100 may be attached to the top surface of the substrate 510 using the adhesive agent 530. Subsequently, the wires 540 may be formed to electrically connect the semiconductor chip 100 to the substrate 510. Finally, the mold resin material 550 may be formed to encapsulate the semiconductor chip 100 and the wires 540.

According to the embodiments set forth above, a non-conductive material pattern may fill an arch-shaped groove formed in a bottom of a semiconductor chip. Thus, the solidity of the semiconductor chip may be improved because of the presence of the non-conductive material pattern. As a result, when the semiconductor chip including the non-conductive material pattern is attached to a package substrate or is diced using a die sawing process, the non-conductive material pattern may suppress or prevent the semiconductor chip from being damaged or broken.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor chip comprising:
a semiconductor chip body having an arch-shaped groove in a backside thereof; and
a non-conductive material pattern filling the arch-shaped groove,
wherein a surface of the non-conductive material pattern is coplanar with a bottom surface of the semiconductor chip body.

2. The semiconductor chip of claim 1, wherein the non-conductive material pattern is a material having a solidity which is greater than that of the semiconductor chip body.

3. The semiconductor chip of claim 1, wherein the non-conductive material pattern has an adhesive property.

4. The semiconductor chip of claim 1, wherein the non-conductive material pattern includes an epoxy type polymer material or a silicon resin material.

5. The semiconductor chip of claim 1, wherein the non-conductive material pattern comprises a material having substantially the same grinding rate as the semiconductor chip body.

6. A semiconductor package comprising:
a substrate;
a semiconductor chip attached to the substrate, the semiconductor chip including a semiconductor chip body having an arch-shaped groove in a backside thereof and a non-conductive material pattern filling the arch-shaped groove; and
a mold resin material encapsulating the semiconductor chip,
wherein a surface of the non-conductive material pattern is coplanar with a bottom surface of the semiconductor chip body.

7. The semiconductor package of claim 6, wherein the semiconductor chip is electrically connected to the substrate through wires, the mold resin material encapsulating the semiconductor chip and wires.

8. The semiconductor package of claim 6, wherein the non-conductive material pattern is a material having a solidity which is greater than that of the semiconductor chip body.

9. The semiconductor package of claim 6, wherein the non-conductive material pattern has an adhesive property.

10. The semiconductor package of claim 6, wherein the non-conductive material pattern includes an epoxy type polymer material or a silicon resin material.

11. The semiconductor package of claim 6, wherein the non-conductive material pattern is attached to the substrate.

* * * * *